(12) United States Patent
Oh

(10) Patent No.: US 8,163,445 B2
(45) Date of Patent: Apr. 24, 2012

(54) EXTREME ULTRAVIOLET MASK AND METHOD FOR FABRICATING THE SAME

(75) Inventor: Sung Hyun Oh, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 374 days.

(21) Appl. No.: 12/345,809

(22) Filed: Dec. 30, 2008

(65) Prior Publication Data

US 2009/0233185 A1 Sep. 17, 2009

(30) Foreign Application Priority Data

Mar. 11, 2008 (KR) .................. 10-2008-0022656

(51) Int. Cl.
    *G03F 1/00* (2012.01)
(52) U.S. Cl. .......................................... 430/5
(58) Field of Classification Search ............ 430/5
    See application file for complete search history.

(56) References Cited

U.S. PATENT DOCUMENTS

| 7,049,035 | B2 | 5/2006 | Kindt et al. ............... 430/5 |
| 7,090,948 | B2 | 8/2006 | Rau |
| 7,413,831 | B2 | 8/2008 | Sugawara |
| 2005/0208389 | A1* | 9/2005 | Ishibashi et al. .......... 430/5 |
| 2007/0031741 | A1* | 2/2007 | Kim et al. ................. 430/5 |
| 2007/0224523 | A1 | 9/2007 | Huh et al. |

FOREIGN PATENT DOCUMENTS

| CN | 1908702 A | 2/2007 |
| JP | 11-133586 | 5/1999 |
| KR | 10-0735531 | 6/2007 |
| KR | 10-2007-0086692 | 8/2007 |

* cited by examiner

*Primary Examiner* — Mark F Huff
*Assistant Examiner* — Jonathan Jelsma
(74) *Attorney, Agent, or Firm* — Marshall, Gerstein & Borun LLP

(57) ABSTRACT

An EUV mask comprises a multi-reflecting layer is formed over a substrate and reflecting EUV light; an absorber layer pattern defining a sidewall formed over the multi-reflecting layer formed and selectively exposing a region of the multi-reflecting layer; and a reflecting spacer which additionally reflects the EUV light at the sidewall of the absorber layer pattern.

10 Claims, 5 Drawing Sheets

EXTREME ULTRAVIOLET MASK AND METHOD FOR FABRICATING THE SAME

CROSS-REFERENCE TO RELATED APPLICATION

Priority to Korean patent application number 10-2008-0022656 filed on Mar. 11, 2008, the entire disclosure of which is incorporated herein by reference, is claimed.

BACKGROUND OF THE INVENTION

The invention relates generally to a photomask and a method for fabricating the same and, more particularly, to an extreme ultraviolet (EUV) mask and a method for fabricating the same.

As the degree of integration of semiconductor devices increases and the design rule decreases, pattern sizes required for the devices are rapidly reduced. Therefore, as the wavelength of light used in a photolithographic apparatus becomes shorter and shorter, technologies to overcome a limit resolution in a photolithographic process for forming the pattern have been developed. For example, immersion lithography, Double Patterning Technology (DPT), and Extreme Ultra-Violet (EUV) lithography have been suggested.

The EUV lithography process uses light having a wavelength of 13.4 nm i.e. EUV, which is shorter than KrF or ArF light, to form a pattern less than 32 nm in size. A mask used in the EUV lithography includes a reflecting layer formed in a multilayer structure of a molybdenum layer and a silicon layer, on which an absorber layer pattern is formed as a shape of the pattern to be transferred onto a wafer. In order to obtain a reflection efficiency of about 67% in the EUV lithography process, the reflecting layer having a multilayer structure of molybdenum layer and silicon layer generally includes 40 to 50 layers. Increases in the size of the reflecting layer leads to increases in mask fabrication cost and increases in the probability of generating foreign substances during a deposition process. The EUV mask is formed in a shape such that the absorber layer pattern is projected above the reflecting layer. Light reflected from the EUV mask shows an intensity distribution in wherein the light intensity is highest in the center of the portion of the reflecting layer exposed by the absorber layer pattern and is lowered in the direction of the edge portion between the reflecting layer and the absorber layer pattern. Due to this light intensity distribution, the contrast of the transferred pattern is lowered. Therefore, the image of the pattern transferred onto the wafer becomes inaccurate, thereby resulting in poor exposure.

SUMMARY OF THE INVENTION

In one embodiment, an EUV mask includes a multi-reflecting layer formed over a substrate and reflecting EUV light; an absorber layer pattern which defines a sidewall and is formed over the multi-reflecting layer formed and selectively exposes a region of the multi-reflecting layer; and a reflecting spacer which additionally reflects the EUV light disposed at the sidewall of the absorber layer pattern.

Preferably, the reflecting spacer has a shape wherein thickness thereof gradually decreases along an inclined surface extending from the sidewall, so that reflectivity decreases with the decrease of the thickness.

In another embodiment, a method for fabricating an EUV mask includes forming a multi-reflecting layer over a substrate; forming an absorber layer pattern defining a sidewall over the multi-reflecting layer; and forming a reflecting spacer, which additionally reflects the EUV light, disposed at a sidewall of the absorber layer pattern.

DESCRIPTION OF SPECIFIC EMBODIMENTS

Hereinafter, a method for fabricating an EUV mask according to the invention is described in detail with reference to the accompanying drawings.

Figure 1:
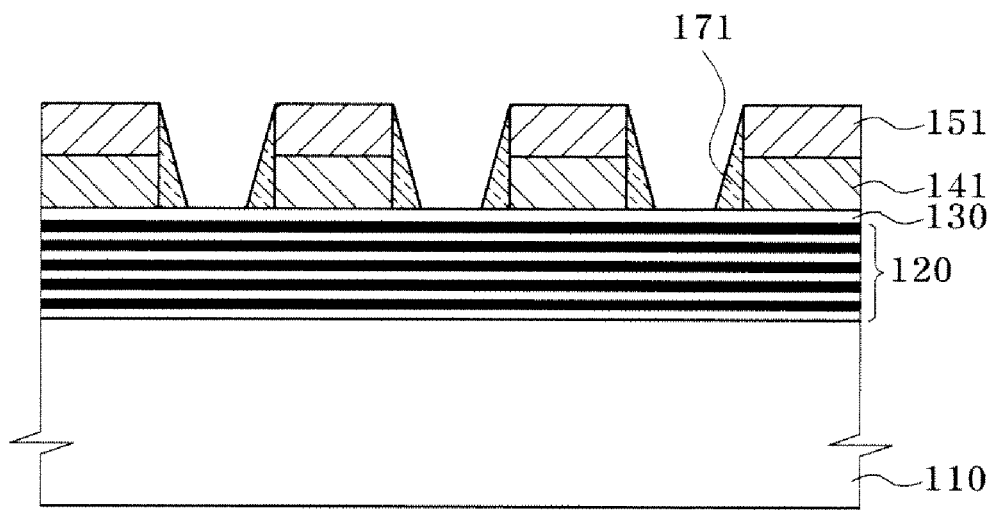
FIG. 1 illustrates a cross-sectional view of an EUV mask according to an embodiment of the invention.

Referring to FIG. 1, a mask used in EUV lithography includes a multi-reflecting layer 120 formed over a substrate 110 to reflect EUV light, an absorber layer pattern 151 formed over the multi-reflecting layer 120 to expose a region of the multi-reflecting layer 120, and a reflecting spacer 171 which additionally reflects the EUV light at sidewalls of the absorber layer pattern 151. At this time, the mask may further include a capping layer 130 formed over the multi-reflecting layer 120 and a buffer layer pattern 141 formed in an edge defined between the capping layer 130 and the absorber layer pattern 151. The multi-reflecting layer 120 is preferably formed in such a manner that a plurality of double layers of molybdenum and silicon are repeatedly stacked. The capping layer 130 prevents oxidation of the multi-reflecting layer 120 and prevents an attack of the multi-reflecting layer 120 upon formation of the absorber layer pattern 151. The buffer layer pattern 141 protects the multi-reflecting layer 120 during a subsequent etching process or modification process. The reflecting spacer 171 preferably comprises a silicon (Si) layer or a ruthenium (Ru) layer. If necessary, the reflecting spacer 171 may comprise a double layer of molybdenum and silicon. At this time, the reflecting spacer 171 has a shape in that a thickness thereof gradually increases as its surface inclines away from the sidewall of the absorber layer pattern 151. Therefore, reflectivity of the reflecting spacer 171 increases with the increase of the thickness.

Figure 2:
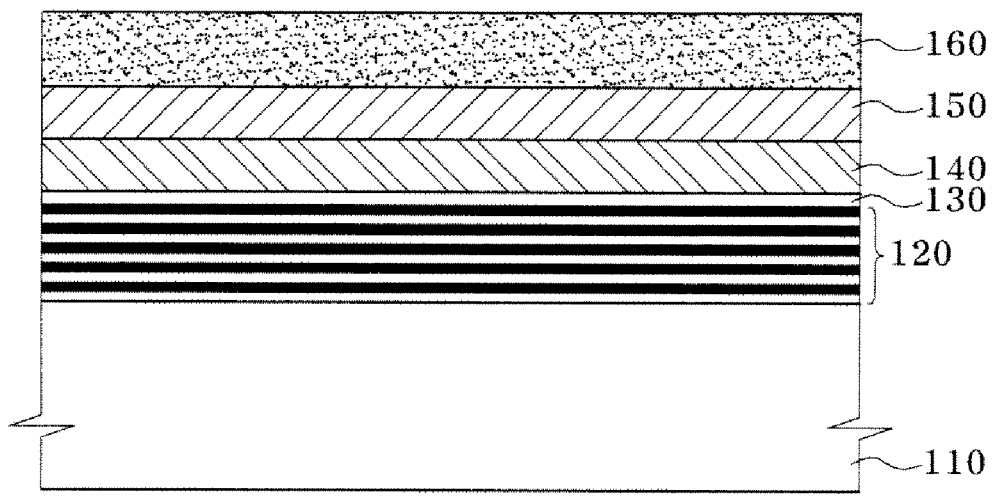
FIGS. 2 to 9 illustrate a process of fabricating an EUV mask according to an embodiment of the invention.

Hereinafter, a method for fabricating the EUV mask as described above is described in detail. Referring to FIG. 2, the multi-reflecting layer 120, the capping layer 130, a buffer layer 140, an absorber layer 150, and a mask layer 160 are sequentially formed over the substrate 110, which illustratively comprises quartz. The multi-reflecting layer 120 is preferably formed by repeatedly stacking double layers of molybdenum and silicon, typically in 40 to 50 layers, to a thickness capable of reflecting EUV, e.g. 13.4 nm light irradiated to the mask. The capping layer preferably comprises a silicon layer to a thickness of 100 Å to 110 Å. The capping layer 130 prevents oxidation of the multi-reflecting layer 120 and prevents an attack of the multi-reflecting layer 120 upon subsequent patterning of the buffer layer 140. The buffer layer 140 is preferably formed of a chrome nitride (CrN) layer or a silicon oxide ($SiO_2$) layer to a thickness of 90 Å to 100 Å. The buffer layer 140 protects the multi-reflecting layer 120 during subsequent etching process or modification process. The absorber layer 150 is preferably formed of a material such as a TaBN and TaBO layer, for example, which can absorb the EUV, e.g. 13.4 nm, light irradiated to the mask during a subsequent exposure process. The mask layer 160 is preferably but not necessarily formed of an electron beam resist layer. The mask layer 160 is patterned through an electron beam lithography process and acts as an etching mask during subsequent patterning of the absorber layer.

Figure 3:
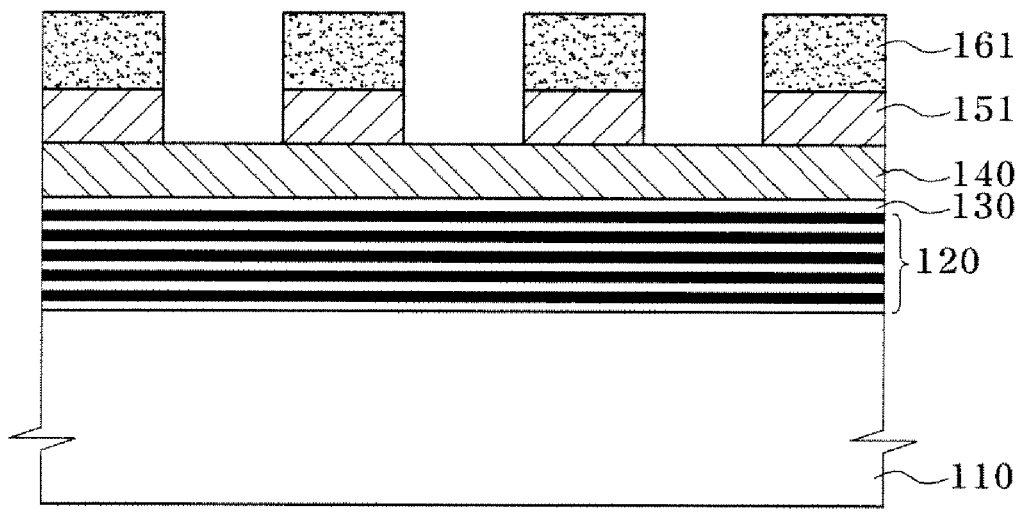

Referring to FIG. 3, the mask layer is patterned to form a mask layer pattern 161 which selectively exposes a region of the absorber layer. Specifically, in a case wherein the mask layer is formed of an electron beam resist layer, an exposure process is performed by selectively exposing the electron beam resist layer to an electron beam, and a development process is performed on the exposed electron beam resist layer using a developing solution. Then, the portion irradiated or not irradiated by the electron beam is selectively removed, thereby forming the mask layer pattern 161 which selectively exposes the absorber layer.

The exposed absorber layer is etched using the mask layer pattern 161 as an etching mask to form the absorber layer pattern 151. The absorber layer pattern 151 selectively absorbs EUV light irradiated to the mask during a subsequent EUV lithography process. For example, when EUV light is irradiated to the mask, the light is absorbed in the absorber layer pattern 151 and is reflected at the surface of the multi-reflecting layer 120 selectively exposed by the absorber layer pattern 151.

Figure 4:
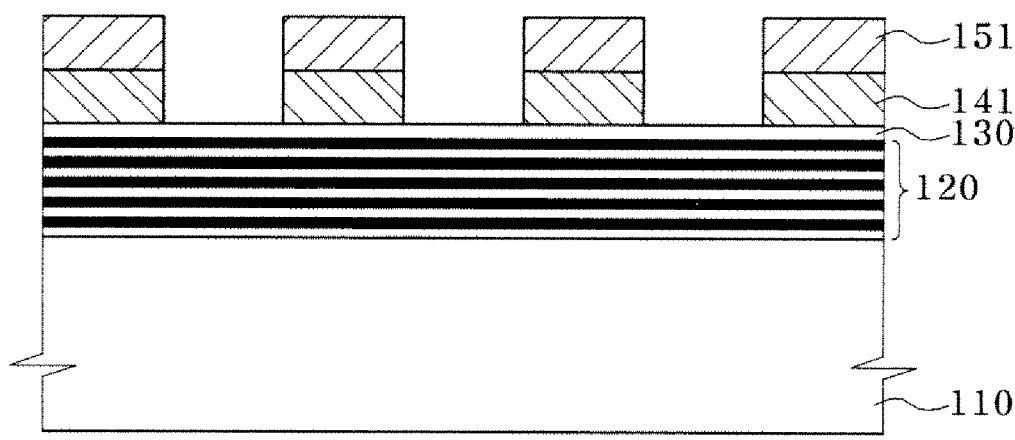
Figure 7:
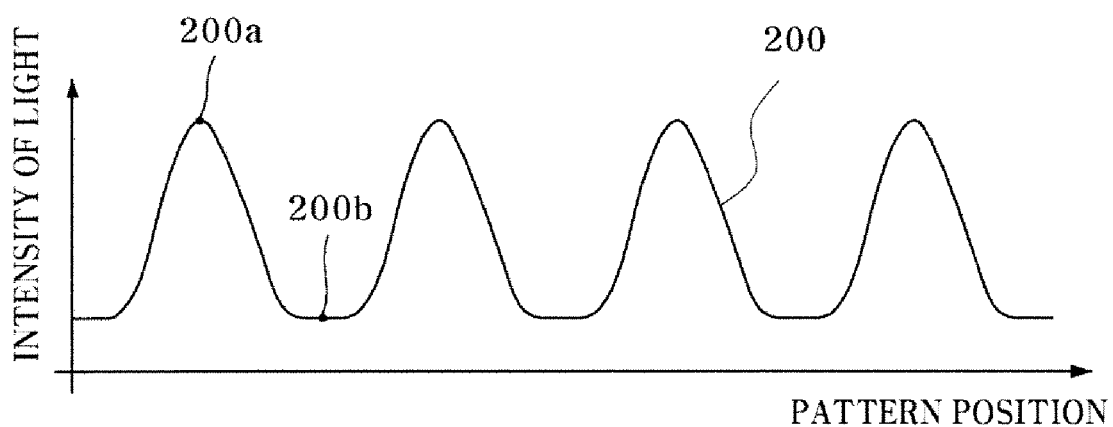

Referring to FIG. 4, after removing the mask layer pattern (161 in FIG. 3), the exposed buffer layer is etched using the absorber layer pattern 151 as an etching mask to form the buffer layer pattern 141. The buffer layer pattern 141 and the absorber layer pattern 151 are formed in a shape projecting above the multi-reflecting layer 120, and the buffer layer pattern 141 and the absorber layer pattern 151 thus have height differences from the multi-reflecting layer 120. Therefore, the intensity of the light irradiated to and reflected from the EUV mask has, as shown in FIG. 7, a distribution such that the light intensity 200 is highest in the center 200*a* of the portion of the multi-reflecting layer 120 exposed by the absorber layer pattern 151 and is lowered as goes to the edge 200*b* portion between the surface of the multi-reflecting layer 120 and the absorber layer pattern, which leads to lowering in the contrast of the light. Therefore, the image of the pattern transferred onto the wafer becomes inaccurate, thereby resulting in poor exposure.

Figure 5:
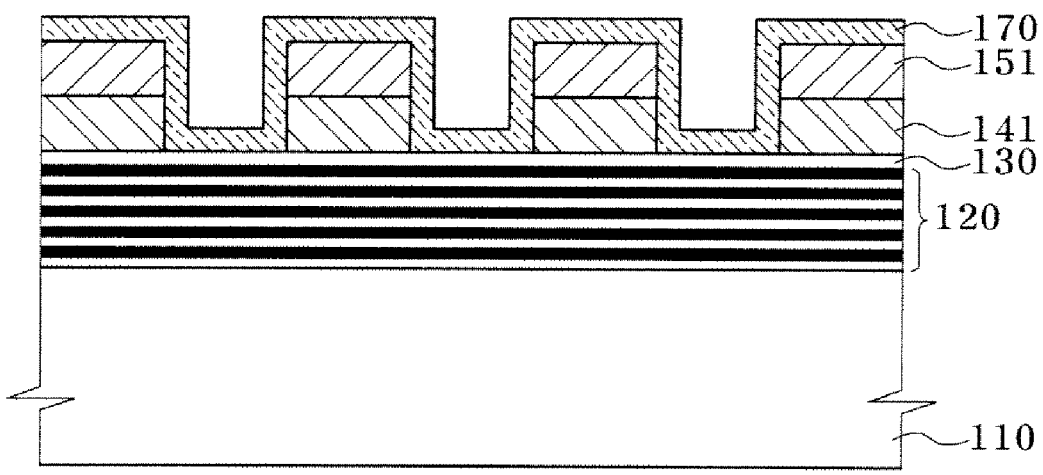

Referring to FIG. 5, a spacer material layer 170 which can reflect the light irradiated to the mask is formed over the buffer layer pattern 141, the absorber layer pattern 151, and the exposed multi-reflecting layer 120 (or the capping layer). The spacer material layer 170 is a layer to be formed in a spacer shape on the sidewalls of the buffer layer pattern 141 and the absorber pattern 151 and preferably comprises a silicon (Si) layer or a ruthenium (Ru) layer. If necessary or desired, the spacer material layer 170 may comprise a double layer of molybdenum and silicon.

Figure 6:
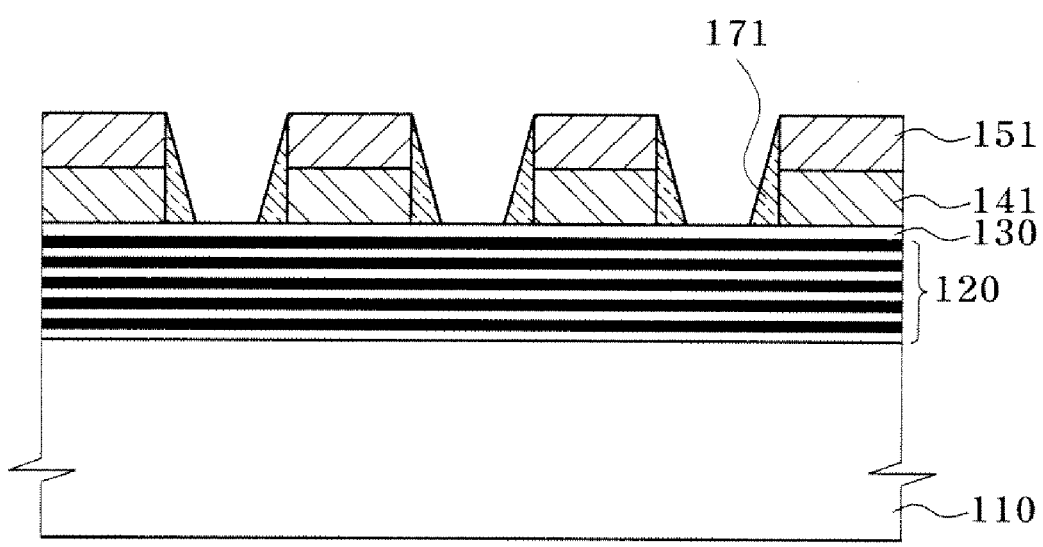
Figure 8:
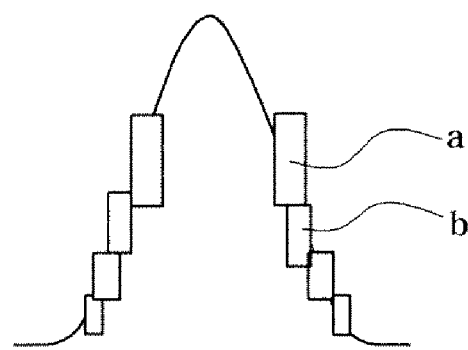
Figure 9:
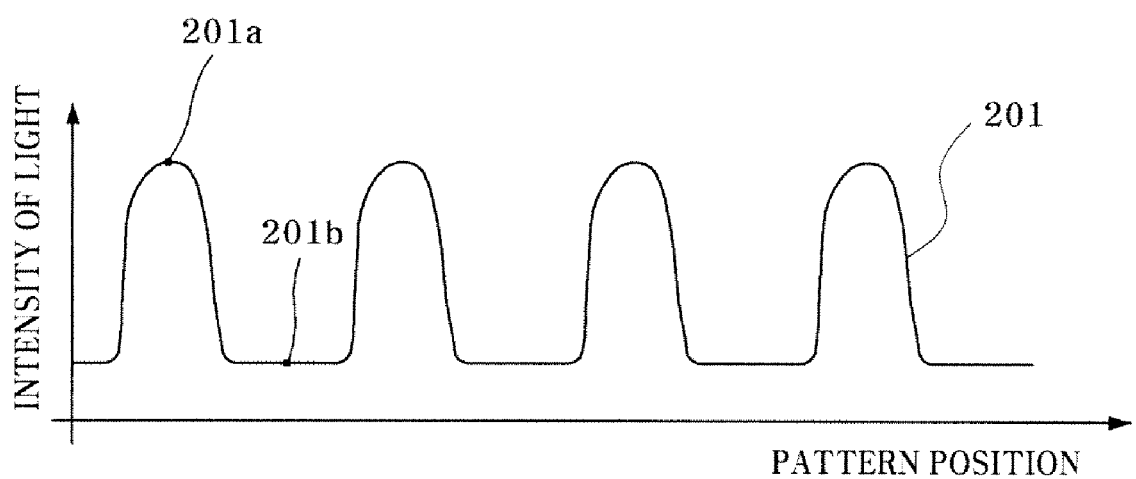

Referring to FIG. 6, anisotropic etching or taper etching process is performed on the spacer material layer to form the reflecting spacer 171 which additionally reflects the EUV light at sidewalls of the absorber layer pattern 151 and the buffer layer pattern 141. The reflecting spacer 171 has a shape in that a thickness thereof is gradually increased along its inclined surface inclined from the sidewalls of the absorber layer pattern 151 and the buffer layer pattern 141. Therefore, reflectivity is increased with the increase of the thickness of the reflecting spacer 171. For example, as shown in FIG. 8, reflection of the light is relatively high at the portion a with a low thickness of the reflecting spacer 171 having a shape wherein the thickness thereof is gradually increased along the inclined surface inclined away from the sidewall of the buffer layer pattern 141 and the reflection of the light is relatively large at the portion b of with a small thickness of the reflecting spacer 171. Therefore, as shown in FIG. 9, it is possible to obtain additional reflection effect at the edge portion between the multi-reflecting layer 120 and the absorber layer pattern 151 when the light is irradiated to and reflected from the EUV mask. Accordingly, it is possible to enhance the contrast of the irradiated light since the light intensity equal to that at the center 201 a portion of the multi-reflecting layer 120 exposed by the absorber layer pattern 151 can be obtained at the edge 201*b* portion between the multi-reflecting layer 120 and the absorber layer pattern 151. Consequently, it is possible to reduce the number of the additionally stacked layers in the multi-reflecting layer in order to obtain the reflection efficiency of about 67% in the EUV lithography process, and it is also possible to save the mask fabrication cost. Further, it is possible to restrict the increase in the foreign substances due to the increase in the layers in the multilayer structure, and is possible to stably realize the pattern of 32 nm or less.

While the invention has been described with respect to the specific embodiments, various changes and modifications may be made without departing from the spirit and scope of the invention as defined in the following claims.

What is claimed is:

1. An extreme ultraviolet (EUV) mask, comprising:
    a multi-reflecting layer formed over a substrate and reflecting EUV light;
    an absorber layer pattern defining a vertical sidewall and formed over the multi-reflecting layer and selectively exposing a region of the multi-reflecting layer; and
    a reflecting spacer which additionally reflects the EUV light disposed at a sidewall of the absorber layer pattern, wherein the reflecting spacer has a shape wherein the thickness thereof gradually increases along an inclined surface extending from the sidewall, so that reflectivity is increased with the increase in thickness, and the reflecting spacer extends from an uppermost sidewall to a bottommost sidewall of the absorber layer pattern.

2. The EUV mask of claim 1, wherein the multi-reflecting layer comprises a structure wherein a plurality of double layers of molybdenum and silicon are repeatedly stacked.

3. The EUV mask of claim 1, wherein the absorber layer pattern comprises a TaBN layer or a TaBO layer.

4. The EUV mask of claim 1, wherein the reflecting spacer comprises a silicon layer, a ruthenium layer, or a double layer of molybdenum and silicon.

5. A method for fabricating an extreme ultraviolet (EUV) mask, comprising:
    forming a multi-reflecting layer over a substrate;
    forming an absorber layer pattern over the multi-reflecting layer, said absorber layer pattern defining a vertical sidewall; and
    forming a reflecting spacer, which additionally reflects the EUV light, disposed at a sidewall of the absorber layer pattern,
    wherein the reflecting spacer has a has a shape wherein a thickness thereof gradually increases along an inclined surface extending from the sidewall, so that reflectivity is increased with the increase in thickness,
    wherein the reflecting spacer extends from an uppermost sidewall to a bottommost sidewall of the absorber layer pattern.

6. The method of claim 5, wherein the multi-reflecting layer comprises a plurality of repeatedly stacked double layers of molybdenum and silicon.

7. The method of claim 5, wherein the absorber layer pattern comprises a TaBN layer or a TaBO layer.

8. The method of claim 5, wherein the reflecting spacer comprises a silicon layer, a ruthenium layer, or a mixed layer containing molybdenum and silicon.

9. The method of claim 5, further comprising:
    forming a capping layer over the multi-reflecting layer; and
    forming a buffer layer pattern over the capping layer.

10. The method of claim 9, wherein the capping layer comprises a silicon layer and the buffer layer pattern comprises a chrome nitride layer or a silicon oxide layer.

* * * * *